United States Patent
Jin et al.

(10) Patent No.: US 7,713,803 B2
(45) Date of Patent: May 11, 2010

(54) MECHANISM FOR FORMING A REMOTE DELTA DOPING LAYER OF A QUANTUM WELL STRUCTURE

(75) Inventors: Been-Yih Jin, Lake Oswego, OR (US); Jack T. Kavalieros, Portland, OR (US); Suman Datta, Beaverton, OR (US); Amlan Majumdar, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 11/731,266

(22) Filed: Mar. 29, 2007

(65) Prior Publication Data

US 2008/0237573 A1    Oct. 2, 2008

(51) Int. Cl.
  *H01L 21/336*    (2006.01)
(52) U.S. Cl. ............... 438/172; 257/194; 257/E21.403; 438/197
(58) Field of Classification Search ................. 438/167, 438/172, 176; 257/E21.403
  See application file for complete search history.

(56) References Cited

U.S. PATENT DOCUMENTS 5,488,237 A    1/1996  Kuwata

| | | | |
|---|---|---|---|
| 2002/0125475 A1* | 9/2002 | Chu et al. | 257/55 |
| 2004/0094811 A1 | 5/2004 | Takagi | |
| 2004/0161006 A1 | 8/2004 | Chang | |
| 2006/0148182 A1* | 7/2006 | Datta et al. | 438/289 |
| 2008/0237572 A1* | 10/2008 | Chui et al. | 257/14 |

OTHER PUBLICATIONS

Chien et al., Device Linear Improvement Using SiGe/Si Heterostructure Delta-Doped-Channel Field-Effect Transistors, Jpn. J. Appl. Phys., Col. 39, (2000) pp. L1149-L1151.*
Jin et al., SiGe Diffusion Barriers for P-doped Si-SiGe Resonant Interband Tunnerl Diodes, IEEE, 2002, pp. 265-269.*
Ducroquet et al., Double SiGe:C diffusion barrier channel 40nm CMOS with improved short-channel performances, IEEE, 2004, pp. 17.5.1-17.5.4.*
"PCT Search Report and Written Opinion", PCT/US2008/058446, (Aug. 18, 2008), 10 pages.

* cited by examiner

*Primary Examiner*—David Vu
*Assistant Examiner*—Earl N Taylor
(74) *Attorney, Agent, or Firm*—Blakely, Sokoloff, Taylor & Zafman LLP

(57) ABSTRACT

A method of fabricating a quantum well device includes forming a diffusion barrier on sides of a delta layer of a quantum well to confine dopants to the quantum well.

9 Claims, 6 Drawing Sheets

- 50A Si barrier stops P diffusion from Ge, both as dep and after 600C, 1' activation anneal (P in Ge).

- 50A SiGe(69%) barrier is shown ineffective in stopping the P diffusion into the undoped Ge region after 600C, 1' anneal.

US 7,713,803 B2

MECHANISM FOR FORMING A REMOTE DELTA DOPING LAYER OF A QUANTUM WELL STRUCTURE

FIELD OF THE INVENTION

Embodiments of the present invention relate to semiconductor integrated circuits, and more particularly to field effect transistors, and methods for fabricating the transistors.

BACKGROUND

Quantum wells are formed in semiconductor devices such as diode lasers, High Electron Mobility Transistors (HEMTs) used in low-noise electronics and infrared photodetectors used for infrared imaging. Particularly, a quantum well is a potential well that confines particles, which were originally free to move in three dimensions, to two dimensions, forcing them to occupy a planar region. The effects of quantum confinement take place when the quantum well thickness becomes comparable at the de Broglie wavelength of the carriers (generally electrons and holes); leading to energy levels called "energy subbands", i.e., the carriers can only have discrete energy values.

Quantum wells are formed in semiconductors by having a material, like gallium arsenide sandwiched between two layers of a material with a wider bandgap, like aluminum arsenide. These structures can be grown by molecular beam epitaxy or chemical vapor deposition with control of the layer thickness down to monolayers.

In order to achieve high mobility quantum well device structures, a key element is the ability to confine dopants in close proximity to the intrinsic quantum well. Such a requirement is not easily met in many cases due to the uncontrolled diffusivity of such dopants. The dopants in a delta doped layer can diffuse or "spill into" the quantum well during the subsequent growth and annealing steps and hence degrade the device mobility/performance.

A partial solution to the problem of dopant out-diffusion from the delta doped layer during subsequent dopant activation annealing steps is the use of ultra fast ramping RTA (rapid thermal annealing). This does not address dopant diffusion/spread entirely though since dopants can also diffuse during the remainder of the growth process for the surrounding high energy gap material. Furthermore many other subsequent processes such as metallization, spacer formation, etc. may not be compatible with the ultra low thermal budget requirements for maintaining the delta doped layer.

BRIEF DESCRIPTION OF THE DRAWINGS

The invention is illustrated by way of example and not limitation in the figures of the accompanying drawings, in which like references indicate similar elements, and in which.

DETAILED DESCRIPTION

A mechanism for forming a doped quantum well structure is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

As Complementary Metal-Oxide Semiconductor (CMOS) devices continue to scale down the gate length, one device parameter that is severely impacted by the continual increase of dopants in the channel is the carrier mobility. Thus, remotely doped quantum well structures are increasingly being implemented. The advantages of using remotely doped quantum well structures rather than conventional surface channel devices include higher mobility due to reduced surface roughness and impurity scattering (e.g., dopant not present in the channel), and incorporation of strain in quantum well and with strain stabilization from bottom and cap hetero-epitaxial (Epi) layers. However, as discussed above, dopant out diffusion is a main concern of controlling the high concentration of dopants in the delta doped layer.

According to one embodiment, a quantum well structure is fabricated by forming of a diffusion barrier material on either side of a delta doping layer in order to confine the dopants in close proximity to a quantum well. In such an embodiment, a hetero-epitaxial quantum well structure is grown with a high mobility, narrow band gap, channel layer that is sandwiched between two wider bandgap layers. The electronic band structure at the hetero-junction interface confines either electron or hole carriers using conduction band offset or valence band offset, respectively.

During the growth of the wide band gap layers, heavily doped delta doping layers are grown sufficiently close to the quantum well layer as a carrier reservoir. Prior and after growth of the heavily doped delta layer, thin dopant diffusion barrier layers are grown above and below the heavily doped delta doping layer. The dopant diffusion barrier is formed, in one embodiment, by introducing a layer which has low dopant diffusivity (such as Si in a Ge quantum well structure), or by adding impurity in the wide band gap layers to suppress dopant diffusion (e.g. by adding carbon (C) in Si or SiGe to effectively suppress Boron (B) and Phosphorus (P) diffusion).

Figure 1:
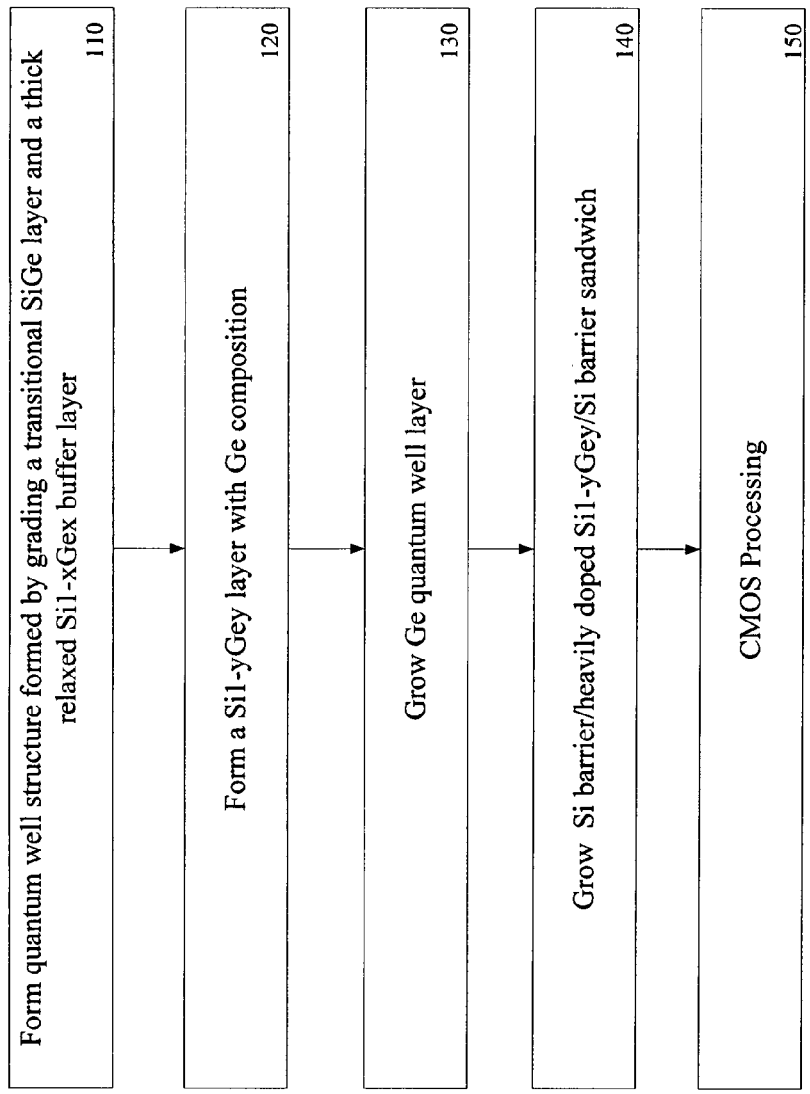
FIG. 1 illustrates one embodiment of a method of fabricating a quantum well device.
Figure 2:
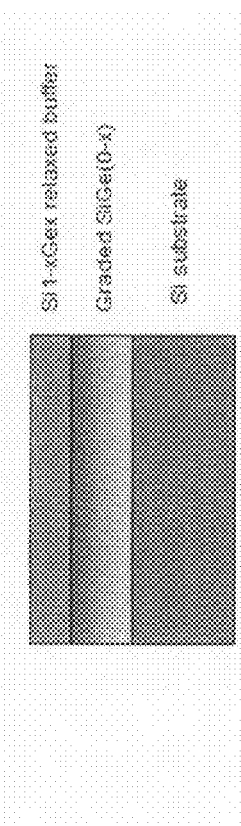
FIGS. 2-6 illustrate one embodiment of various stages in the fabrication of a quantum well device.

FIG. 1 illustrates one embodiment of fabrication processes of one embodiment of a Ge quantum well and a sharp boundary delta doping layer. At processing block 110, a quantum well structure is formed by grading a transitional SiGe layer and a thick relaxed film Epi layer (e.g., $Si_{1-x}Ge_x$) to reduce dislocation defect of the Ge quantum well layer. FIG. 2 illustrates one embodiment of the graded SiGe and $Si_{1-x}Ge_x$ layers formed on the Si substrate.

Figure 3:
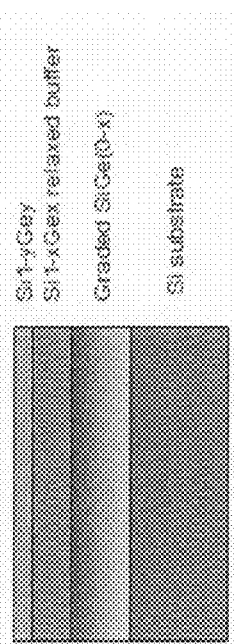

Referring back to FIG. 1, a $Si_{1-y}Ge_y$ layer is formed with the Ge composition tailored to have a desired valence band offset with the Ge quantum well valence band, processing block 120. FIG. 3 illustrates one embodiment of the $Si_{1-y}Ge_y$ layer is formed over the Si1-xGex layer.

Figure 4:
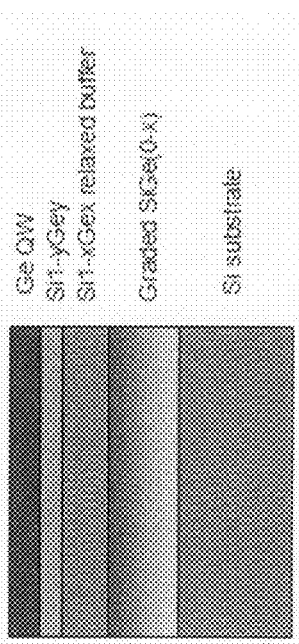
Figure 5:
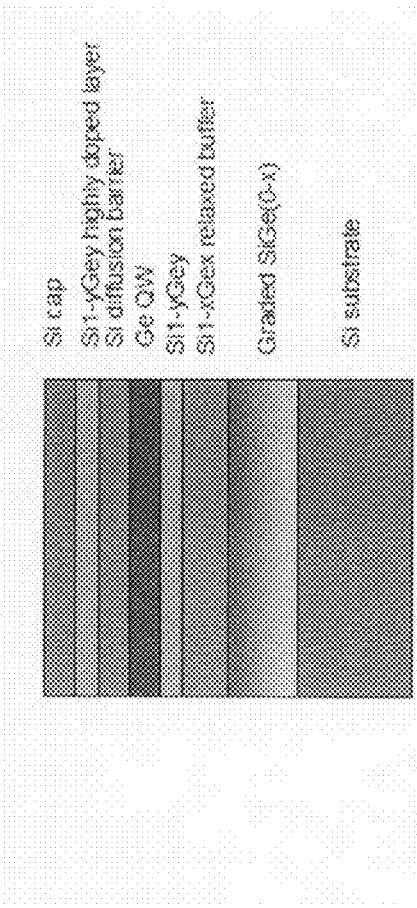
Figure 6:
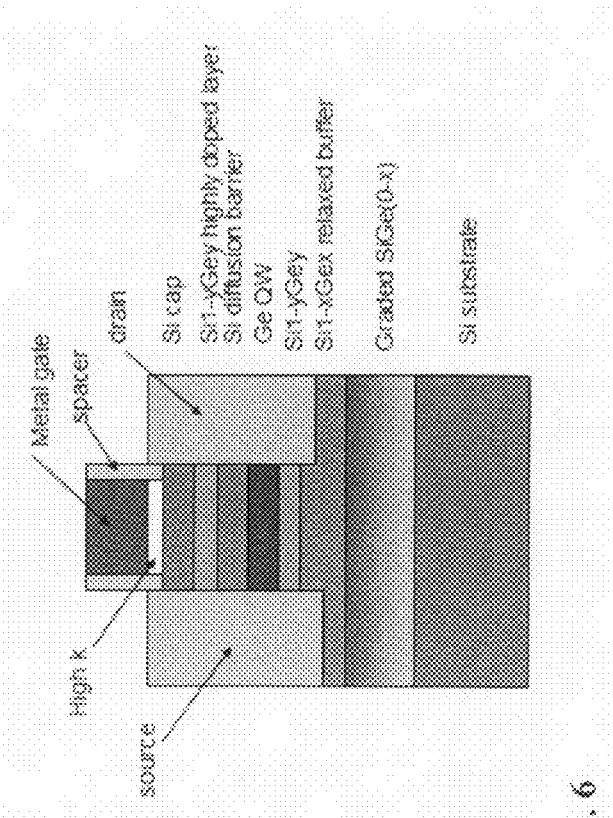

Referring back to FIG. 1, the Ge quantum well layer is grown over the $Si_{1-y}Ge_y$ layer, processing block 130. FIG. 4 illustrates one embodiment of the formed Ge quantum well layer. Referring back to FIG. 1, a Si barrier/heavily doped $Si_{1-y}Ge_y$/Si barrier sandwich is grown to contain the delta dopants, processing block 150. FIG. 5 illustrates one embodiment of the Si barrier/heavily doped $Si_{1-y}Ge_y$/Si barrier formed over the Ge quantum well layer.

Referring back to FIG. 1, industry standard CMOS processing is then carried out to fabricate the remainder of the Ge QW PMOS device on the above substrate, processing block 150. Such processing includes. FIG. 5 illustrates one embodiment of a quantum well device having a diffusion layer surrounded delta doping area. In other embodiments, the diffusion barrier/delta doping layer stack can also be placed under the quantum well.

Figure 7A:
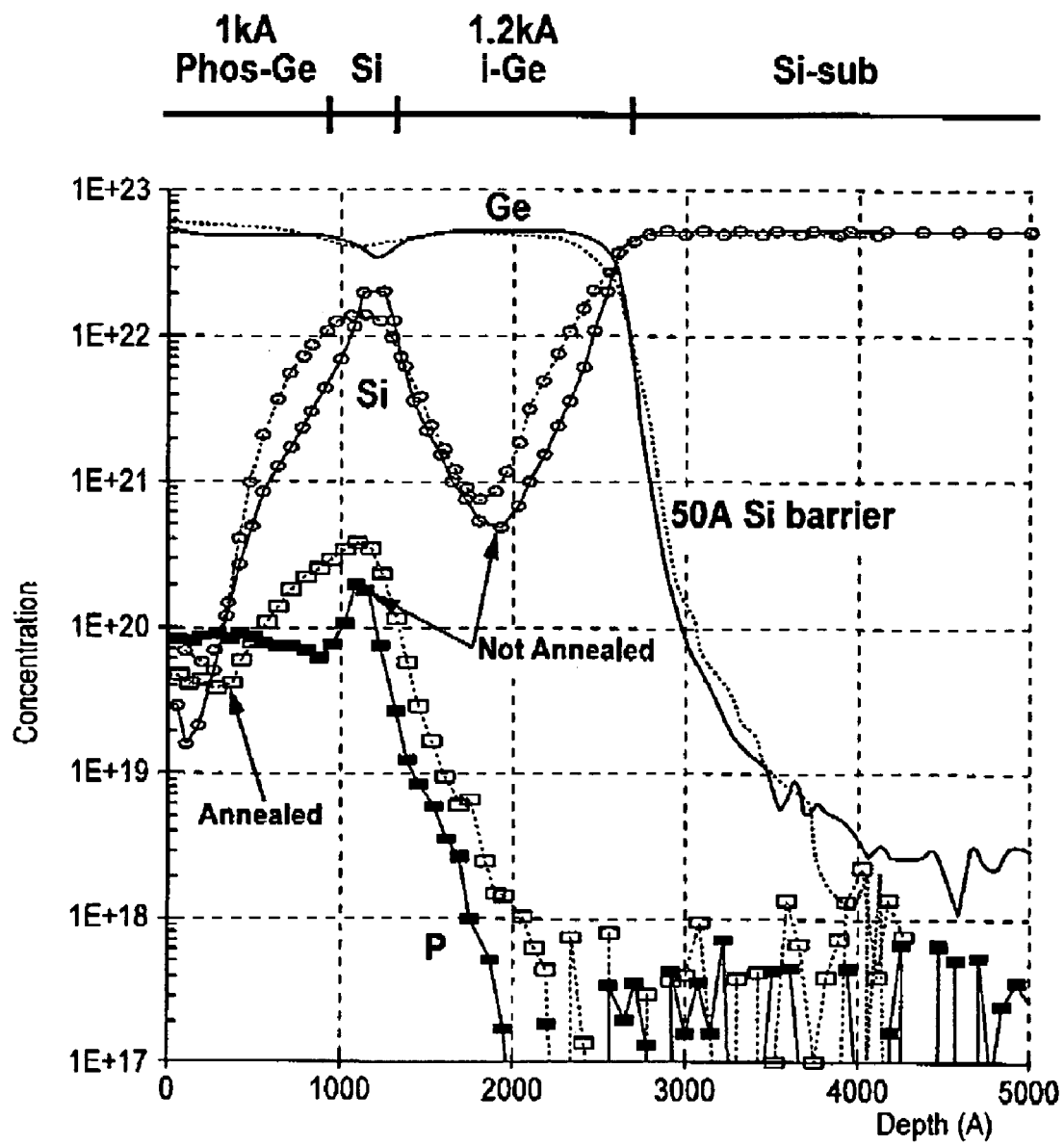
FIGS. 7A and 7B are graphs illustrating dopant diffusion.
Figure 7B:
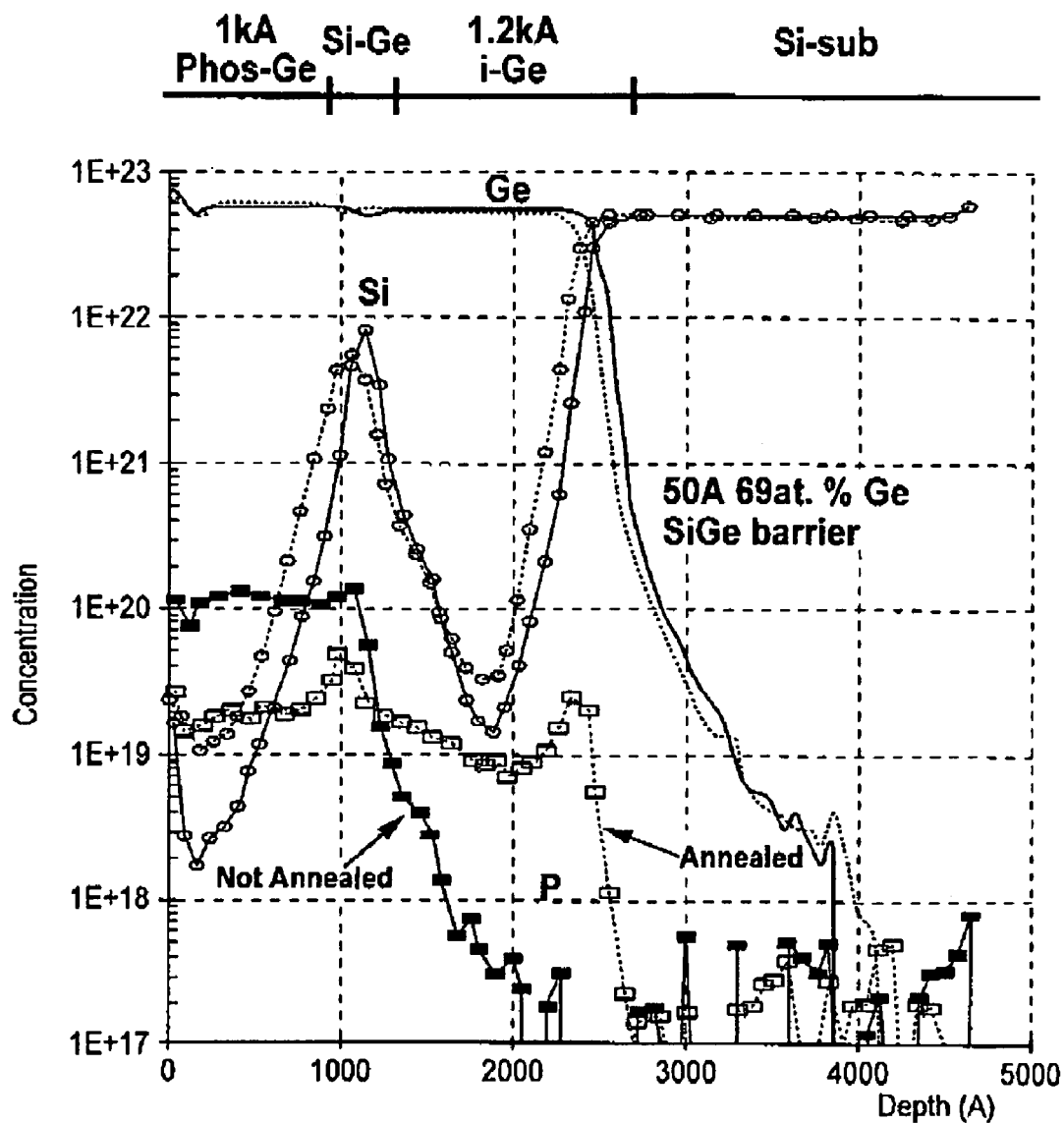

FIGS. 7A and 7B illustrate examples of dopant diffusion barrier layers on blanket wafers for the case of high mobility Germanium (Ge) quantum well layers. The figures show mass spectrometry (SIMS) profile of Phosphorus in a Ge Epi layer grown on a silicon (Si) substrate. A thin 50A Si or a 50A 69% SiGe layer is embedded in Ge as a dopant diffusion layer. Comparing the 50A Si barrier in FIG. 7A and the 50A 69% SiGe barrier of FIG. 7B, the 50A Si effectively blocked the P diffusion in the top n-Ge from diffusing into the undoped i-Ge bottom layer.

Although described above with respect to a GE quantum well structure and, the above-described method may be implemented in other embodiments using any kind of high mobility quantum well structure. In further embodiments, any kind of diffusion barrier may be implemented; including a C doped Si or SiGe.

Figure 8:
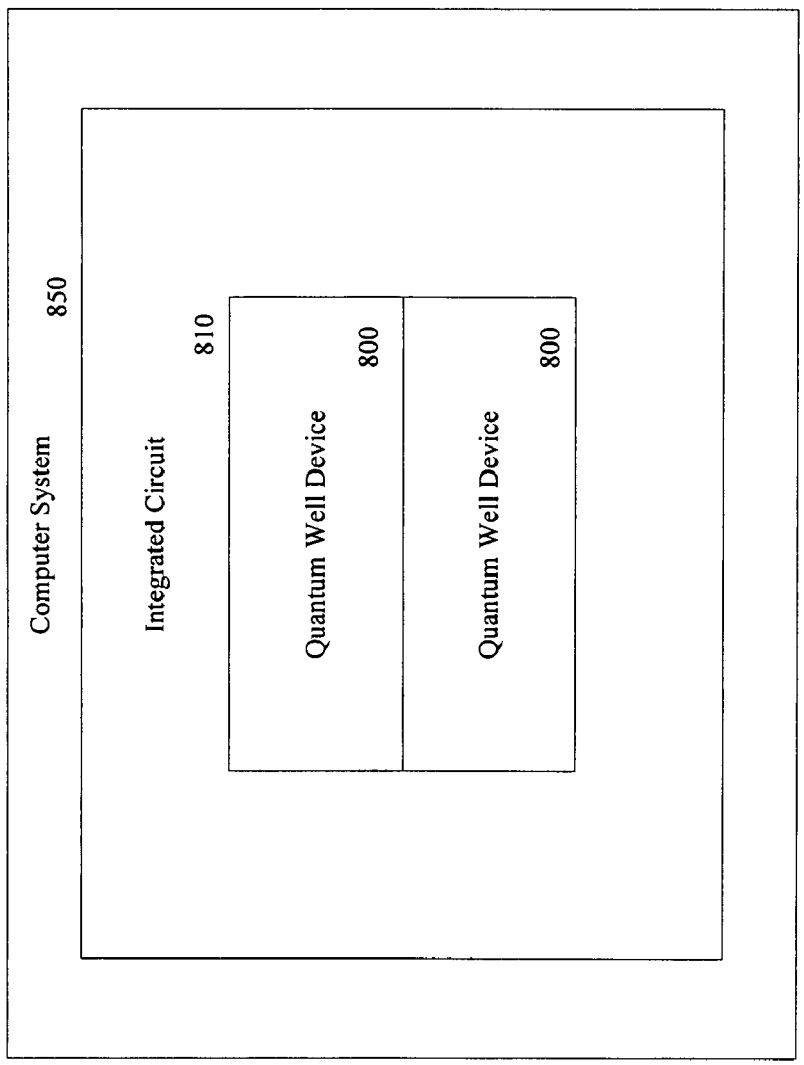
FIG. 8 illustrates that quantum well devices, according to various embodiments of the invention, may be used in an integrated circuit and incorporated into a computer system.

FIG. 8 illustrates that quantum well devices 800, according to various embodiments of the invention, may be used in an integrated circuit 810 (or another chip, monolith device, semiconductor device, or microelectronic device, as they are generally understood in the field) and incorporated into a computer system 850 (or other electrical system). The computer system, which may be a portable, laptop, desktop, server, mainframe, or other computer system, may also include other conventional computer system components, such as a bus to communicate data, a memory to store data (e.g., main memory, read only memory, and/or a mass storage device), a display device to display data, a data entry device (e.g., a keyboard, a cursor control device), and a communication device to link to other electrical systems.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. A method of fabricating a quantum well device comprising forming a first dopant diffusion barrier on a side of a doped delta layer and between the doped delta layer and a quantum well, and further comprising:
   forming a graded transitional layer over a substrate; and
   forming a relaxed film epitaxial layer over the transitional layer.

2. The method of claim 1 further comprising forming a first $Si_{1-y}Ge_y$ layer over the relaxed film epitaxial layer.

3. The method of claim 2 further comprising forming the quantum well over the first $Si_{1-y}Ge_y$ layer.

4. The method of claim 3 further comprising:
   forming a second dopant diffusion barrier over the doped delta layer.

5. The method of claim 2 further comprising fabricating a transistor incorporating the quantum well device.

6. A method of fabricating a quantum well semiconductor device comprising:
   forming a graded transitional layer over a substrate;
   forming a relaxed film epitaxial layer over the transitional layer;
   forming a first $Si_{1-y}Ge_y$ layer over the relaxed film epitaxial layer;
   forming a quantum well over the first $Si_{1-y}Ge_y$ layer;
   forming a first dopant diffusion barrier over the quantum well;
   forming a doped layer on the first dopant diffusion barrier; and
   forming a second dopant diffusion hater over the doped layer.

7. The method of claim 6 further comprising fabricating a transistor incorporating the quantum well semiconductor device.

8. The method of claim 6 wherein an electronic band structure at a hetero-junction interface of the quantum well confines electron carriers using conduction band offset.

9. The method of claim 6 wherein an electronic band structure at a hetero-junction interface of the quantum well confines hole carriers using valence band offset.

* * * * *

UNITED STATES PATENT AND TRADEMARK OFFICE
CERTIFICATE OF CORRECTION

| | | |
|---|---|---|
| PATENT NO. | : 7,713,803 B2 | Page 1 of 1 |
| APPLICATION NO. | : 11/731266 | |
| DATED | : May 11, 2010 | |
| INVENTOR(S) | : Jin et al. | |

It is certified that error appears in the above-identified patent and that said Letters Patent is hereby corrected as shown below:

In column 4, at line 35 delete, "hater" and insert -- barrier --.

Signed and Sealed this
Nineteenth Day of April, 2011

David J. Kappos
*Director of the United States Patent and Trademark Office*